(12) United States Patent
Jeong et al.

(10) Patent No.: US 12,477,930 B2
(45) Date of Patent: Nov. 18, 2025

(54) DISPLAY DEVICE HAVING REFLOW PREVENTION STRUCTURES

(71) Applicant: Samsung Display Co., LTD., Yongin-si (KR)

(72) Inventors: Sehoon Jeong, Suwon-si (KR); Woo Yong Sung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 669 days.

(21) Appl. No.: 17/884,576

(22) Filed: Aug. 10, 2022

(65) Prior Publication Data

US 2023/0051370 A1 Feb. 16, 2023

(30) Foreign Application Priority Data

Aug. 11, 2021 (KR) .......................... 10-2021-0106085

(51) Int. Cl.
*H10K 59/80* (2023.01)
*H10K 59/12* (2023.01)
*H10K 71/00* (2023.01)

(52) U.S. Cl.
CPC ........... *H10K 59/873* (2023.02); *H10K 59/12* (2023.02); *H10K 71/00* (2023.02); *H10K 59/1201* (2023.02)

(58) Field of Classification Search
CPC ...... H10K 50/844; H10K 71/00; H10K 59/12; H10K 59/1201
USPC ............................................... 257/40, 59, 99
See application file for complete search history.

(56) References Cited

U.S. PATENT DOCUMENTS

| 8,390,116 | B1* | 3/2013 | Huemoeller | ........ H01L 21/4853 |
| | | | | 257/737 |
| 9,601,717 | B2 | 3/2017 | Lee et al. | |
| 10,224,383 | B2 | 3/2019 | Park et al. | |
| 11,227,843 | B2 | 1/2022 | Park et al. | |
| 2014/0159002 | A1* | 6/2014 | Lee | .......... H10K 71/00 |
| | | | | 438/34 |
| 2019/0211437 | A1* | 7/2019 | Obata | .................... C23C 16/042 |
| 2020/0185647 | A1* | 6/2020 | Lee | ...................... H10K 59/124 |
| 2021/0202413 | A1* | 7/2021 | Lee | .......... H01L 24/03 |
| 2021/0202664 | A1* | 7/2021 | Kim | ...................... H10K 59/131 |
| 2021/0222283 | A1* | 7/2021 | Obata | .................... C23C 16/042 |

FOREIGN PATENT DOCUMENTS

| CN | 104377311 A | 2/2015 |
| KR | 10-2014-0016474 A | 2/2014 |
| KR | 10-2017-0023268 | 3/2017 |
| KR | 10-2017-0071282 | 6/2017 |
| KR | 10-2020-0118316 | 10/2020 |

* cited by examiner

*Primary Examiner* — Eric W Jones
(74) *Attorney, Agent, or Firm* — Innovation Counsel LLP

(57) ABSTRACT

A display device includes a substrate having a display area and a non-display area surrounding the display area, a driving element disposed on the substrate in the display area, a light emitting element disposed on the driving element, and a dam disposed on the substrate in the non-display area and surrounding the display area, and where the dam includes a first organic layer, a first reflow prevention patterns disposed on both edges of the first organic layer and including a material different from a material of the first organic layer, and a second organic layer disposed on the first organic layer and contacting the first organic layer exposed by the first reflow prevention patterns.

19 Claims, 12 Drawing Sheets

DISPLAY DEVICE HAVING REFLOW PREVENTION STRUCTURES

CROSS REFERENCE TO RELATED APPLICATION

This application claims priority from and the benefits of Korean Patent Application No. 10-2021-0106085, filed on Aug. 11, 2021, which is hereby incorporated by reference for all purposes as if fully set forth herein.

BACKGROUND

Field

Embodiments of the invention relate generally to a display device and more specifically, to an organic light emitting diode display device.

Discussion of the Background

As technology improves, display devices having smaller sizes, lighter weight, and superior performance have been produced. A cathode ray tube television, which is one of the display devices, has been widely used with many advantages in terms of performance and price. The cathode ray tube television has disadvantages in terms of miniaturization or portability. A display device overcomes shortcomings of the cathode ray tube television in terms of miniaturization or portability, and has advantages such as miniaturization, light weight, and low power consumption. For example, a plasma display device, a liquid crystal display device, an organic light emitting display device, and a quantum dot display device are attracting much attention.

The display device may include a display area for displaying an image and a non-display area surrounding the display area. An area of the non-display area may be a dead space of the display device. Accordingly, it is demanded to reduce or minimize a width of the non-display area.

The above information disclosed in this Background section is only for understanding of the background of the inventive concepts, and, therefore, it may contain information that does not constitute prior art.

SUMMARY

Display devices constructed according to the principles and embodiments of the invention are capable of reducing or minimizing a dead space of the display devices corresponding to a non-display area surrounding a display area by improving the structure of a dam for preventing an overflow phenomenon of an organic material. For example, the display devices have a narrow non-display area.

Additional features of the inventive concepts will be set forth in the description which follows, and in part will be apparent from the description, or may be learned by practice of the inventive concepts.

According to one aspect of the invention, a display device includes a substrate having a display area and a non-display area surrounding the display area, a driving element disposed on the substrate in the display area, a light emitting element disposed on the driving element, and a dam disposed on the substrate in the non-display area and surrounding the display area. The dam includes a first organic layer, a first reflow prevention patterns disposed on both edges of the first organic layer and including a material different from a material of the first organic layer, and a second organic layer disposed on the first organic layer and contacting the first organic layer exposed by the first reflow prevention patterns.

The first reflow prevention patterns may include an inorganic material.

The first reflow prevention patterns may include a metal.

The dam may further include a first adhesive pattern disposed between the first reflow prevention patterns.

The first reflow prevention patterns and the first adhesive pattern may include a same material.

The first adhesive pattern may have an inverse tapered shape.

The display device may further include a source layer disposed between the driving element and the light emitting element. The source layer and the first reflow prevention patterns may include a same material.

The dam may further include a second reflow prevention patterns disposed on both edges of the second organic layer and including a material different from a material of the second organic layer, and a third organic layer disposed on the second organic layer and contacting the second organic layer exposed by the second reflow prevention patterns.

The light emitting element may include a pixel electrode, an emission layer disposed on the pixel electrode, and a common electrode disposed on the emission layer. The pixel electrode and the second reflow prevention patterns may include a same material.

The dam may further include a second adhesive pattern disposed between the second reflow prevention patterns.

The second reflow prevention patterns and the second adhesive pattern may include a same material.

The second adhesive pattern may have an inverse tapered shape.

An inclination angle of a side surface of the first organic layer may be less than an inclination angle of a side surface of the second organic layer.

The second organic layer may not cover a side surface of the first organic layer.

A width of the second organic layer may be less than a width of the first organic layer.

The dam may further include a spacer disposed on the second organic layer.

According to another aspect of the invention, a display device includes a substrate having a display area and a non-display area surrounding the display area, a driving element disposed on the substrate in the display area, a light emitting element disposed on the driving element, a source layer disposed between the driving element and the light emitting element, and a dam disposed on the substrate in the non-display area and surrounding the display area. The dam includes a first organic layer, a first reflow prevention patterns disposed on both edges of the first organic layer and including a same material as the source layer, a first adhesive pattern disposed between the first reflow prevention patterns, and a second organic layer disposed on the first organic layer and contacting the first organic layer exposed by the first reflow prevention patterns.

The first reflow prevention patterns and the first adhesive pattern may include a same material.

The dam may further include a second reflow prevention patterns disposed on both edges of the second organic layer and including a material different from a material of the second organic layer, a second adhesive pattern disposed between the second reflow prevention patterns, and a third organic layer disposed on the second organic layer and contacting the second organic layer exposed by the second reflow prevention patterns.

The second reflow prevention patterns and the second adhesive pattern may include a same material.

A reflow phenomenon in which the second organic layer disposed on the first organic layer flows along the side surface of the first organic layer may be prevented by disposing a reflow prevention pattern on the first organic layer of the dam.

An adhesive force between the first organic layer and the second organic layer may be improved by disposing the adhesive pattern on the first organic layer. The width of the second organic layer may be less than the width of the first organic layer. A width of the non-display area may be reduced, and a dead space may be reduced.

As the adhesive pattern has the inverse tapered shape, the adhesive force between the first organic layer and the second organic layer may be effectively improved.

Since the inclination angle of the side surface of the second organic layer is greater than the inclination angle of the side surface of the first organic layer, the dam may effectively prevent an overflow phenomenon in which an organic material such as a monomer overflows.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
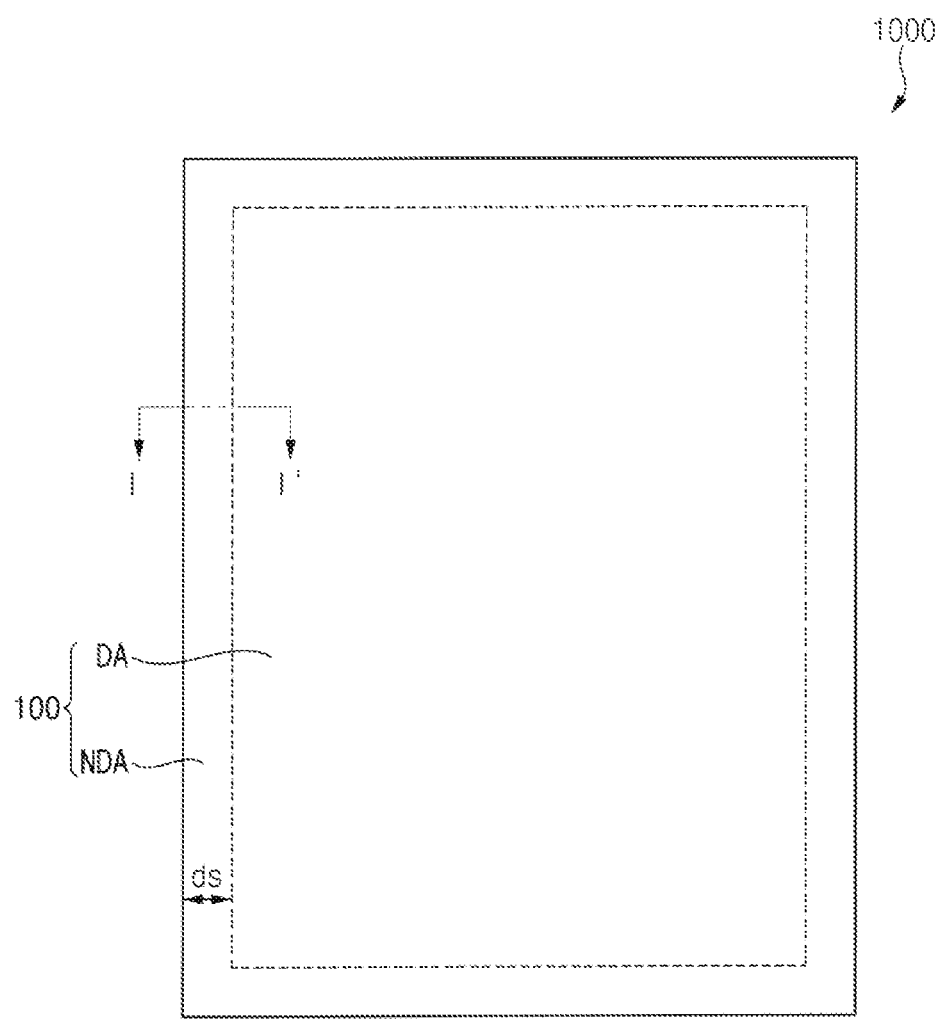
FIG. 1 is a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Illustrative, non-limiting embodiments will be more clearly understood from the following detailed description in conjunction with the accompanying drawings.

FIG. 1 is a plan view illustrating a display device according to an embodiment.

Referring to FIG. 1, a display device 1000 according to an embodiment may include a substrate 100. The substrate 100 may include a display area DA and a non-display area NDA. The display area DA may display an image. The non-display area NDA may surround the display area DA. The non-display area NDA may not display an image. An area of the non-display area NDA may be a dead space. A width ds of the non-display area NDA needs to be reduced.

A plurality of pixels may be disposed in the display area DA. For example, the pixels may be arranged in a matrix form along a first direction DR1 and a second direction DR2 intersecting the first direction DR1. The second direction DR2 may be perpendicular to the first direction DR1. Each of the pixels may include a driving element and a light emitting element. The light emitting element may generate light. For example, the light emitting element may include an organic light emitting diode. For another example, the light emitting element may include a nano light emitting diode. The driving element may provide various signals and various voltages for the light emitting element to generate light.

Figure 2:
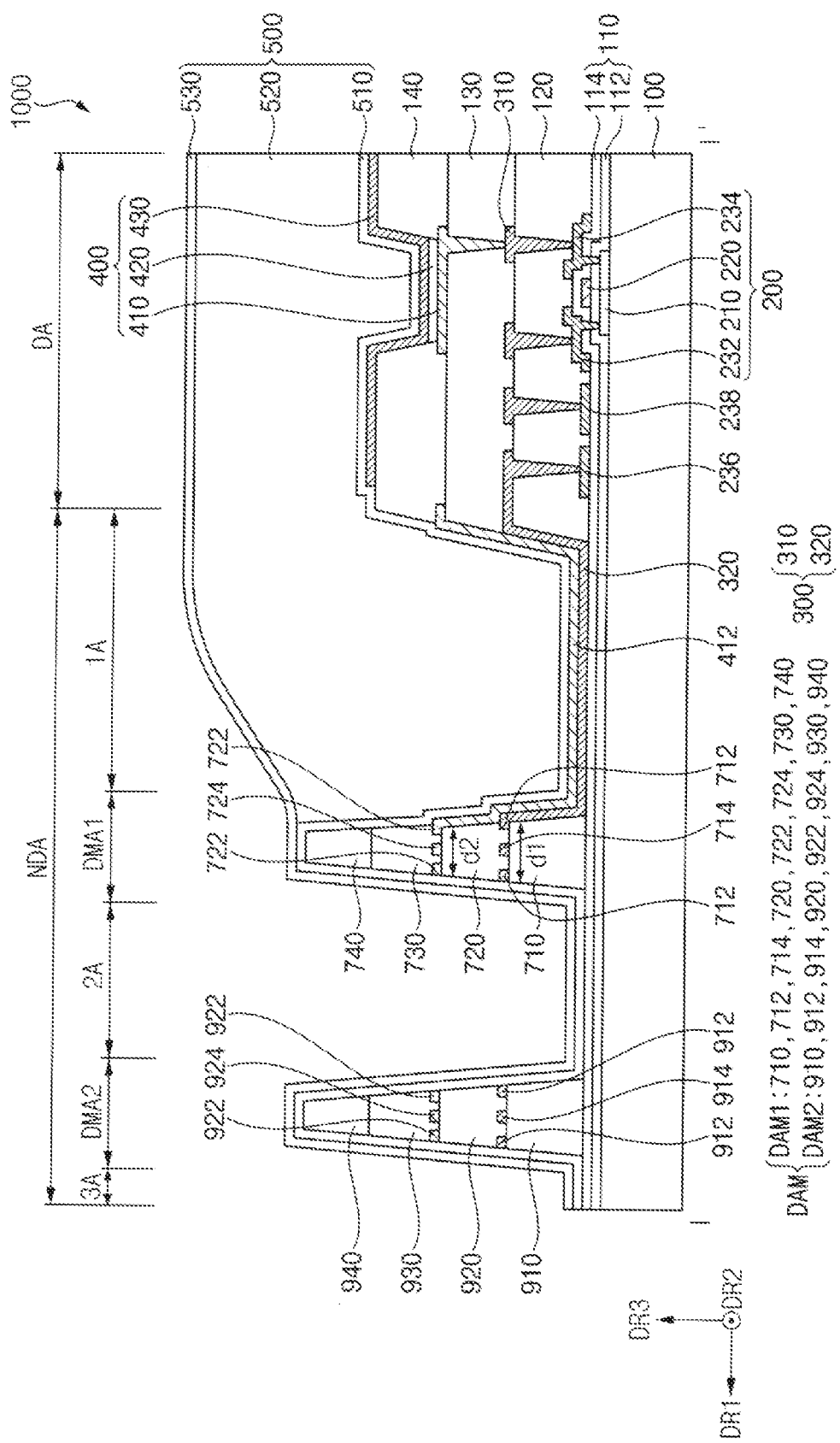
FIG. 2 is a cross-sectional view of the display device of FIG. 1.

FIG. 2 is a cross-sectional view illustrating the display device of FIG. 1.

Referring to FIGS. 1 and 2, the display device 1000 may include the substrate 100, the driving element 200, a gate insulating layer 112, an interlayer insulating layer 114, a first organic insulating layer 120, a second organic insulating layer 130, the light emitting element 400, a pixel defining layer 140, an encapsulation layer 500, a first dam DAM1, and a second dam DAM2. For example, the driving element 200 may include an active layer 210, a gate electrode 220, a source electrode 232, and a drain electrode 234. For example, the light emitting element 400 may include a pixel electrode 410, an emission layer 420, and a common electrode 430. For example, the encapsulation layer 500 may include a first inorganic encapsulation layer 510, an organic encapsulation layer 520, and a second inorganic encapsulation layer 530.

The substrate 100 may be an insulating substrate. For example, the substrate 100 may be a flexible substrate formed of plastic or the like. As a specific example, the substrate 100 may be a polyimide substrate. The polyimide substrate may include a first polyimide layer, a barrier layer, a second polyimide layer, and the like. For another example, the substrate 100 may be a glass substrate, a quartz substrate, a calcium fluoride substrate, or the like.

The substrate 100 may include the display area DA and the non-display area NDA. The non-display area NDA may include a first area 1A, a first dam area DMA1, a second area 2A, a second dam area DMA2, and a third area 3A. The first dam area DMA1 is positioned outside the display area DA and may be spaced apart from the display area DA (e.g., in the first direction DR1). The second dam area DMA2 may be positioned outside the first dam area DMA1 and may be spaced apart from the first dam area DMA1 (e.g., in the first direction DR1). The first area 1A may be positioned between the display area DA and the first dam area DMA1. The second area 2A may be positioned between the first dam area DMA1 and the second dam area DMA2. The third area 3A may be positioned outside the second dam area DMA2.

In the example of FIG. 2, the outside of the display area DA may mean the first direction DR1. The first dam area DMA1 may be spaced apart from the display area DA in the first direction DR1, and the second dam area DMA2 may be spaced apart from the first dam area DMA1 in the first direction DR1.

The active layer 210 may be disposed on the substrate 100 in the display area DA. For example, the active layer 210 may include a silicon semiconductor, an oxide semiconductor, or the like. The silicon semiconductor may include amorphous silicon, polycrystalline silicon, or the like.

For example, a buffer layer may be disposed between the substrate 100 and the active layer 210. For example, the buffer layer may be entirely disposed on the substrate 100 in the display area DA and the non-display area NDA. The active layer 210 may be disposed on the buffer layer in the display area DA. The buffer layer may prevent impurities from diffusing or permeating from the substrate 100 to the active layer 210. For example, the buffer layer may include an inorganic insulating material. For example, the inorganic insulating material may include silicon oxide ($SiO_x$), silicon nitride ($SiN_x$), titanium oxide ($TiO_x$), and tantalum oxide ($TaO_x$).

The gate insulating layer 112 may be disposed on the substrate 100. For example, the gate insulating layer 112 may be entirely disposed on the substrate 100 in the display area DA and the non-display area NDA. The gate insulating layer 112 disposed in the display area DA may cover the active layer 210. For example, the gate insulating layer 112 may include an inorganic insulating material.

The gate electrode 220 may be disposed on the gate insulating layer 112 in the display area DA. The gate electrode 220 may overlap the active layer 210. The gate electrode 220 may include a metal, a metal oxide, or the like. For example, the metal may include silver, molybdenum, aluminum, tungsten, copper, nickel, chromium, titanium, tantalum, platinum, and scandium. For example, the metal oxide may include indium tin oxide and indium zinc oxide.

The interlayer insulating layer 114 may be disposed on the gate insulating layer 112. For example, the interlayer insulating layer 114 may be entirely disposed on the gate insulating layer 112 in the display area DA and the non-display area NDA. The interlayer insulating layer 114 disposed in the display area DA may cover the gate electrode 220 on the gate insulating layer 112. For example, the interlayer insulating layer 114 may include an inorganic insulating material.

The buffer layer, the gate insulating layer 112, and the interlayer insulating layer 114 may be referred to as an inorganic insulating layer 110. The inorganic insulating layer 110 may be entirely disposed between the substrate 100 and the first organic insulating layer 120 in the display area DA and the non-display area NDA.

The source electrode 232 and the drain electrode 234 may be disposed on the interlayer insulating layer 114 in the display area DA. The source electrode 232 and the drain electrode 234 may be connected to the active layer 210. The source electrode 232 and the drain electrode 234 may include a metal, a metal oxide, or the like.

A low power line 236 and a high power line 238 may be disposed on the interlayer insulating layer 114 in the display area DA. The low power line 236 and the high power line 238 may be connected to at least one of the plurality of pixels disposed in the display area DA. The low power line 236 and the high power line 238 may provide voltages to at least one of the pixels such that light is generated by the at least one of the pixels.

The active layer 210, the gate electrode 220, the source electrode 232, and the drain electrode 234 may form the driving element 200. The driving element 200 may be disposed on the substrate 100 in the display area DA.

The first organic insulating layer 120 may be disposed on the interlayer insulating layer 114 in the display area DA and may cover the driving element 200. An upper surface of the first organic insulating layer 120 may be substantially flat. For example, the organic insulating material included in the first organic insulating layer 120 may include photoresist, polyacrylic resin, polyimide resin, polyamide resin, siloxane resin, acrylic resin, and epoxy resin.

A source layer 300 may include a first connection electrode 310 and a second connection electrode 320. The source layer 300 may be disposed on the first organic insulating layer 120. The first connection electrode 310 may be disposed in the display area DA. The second connection electrode 320 may be disposed in the display area DA and may extend from the display area DA to the non-display area NDA. However, embodiments are not limited thereto, and the second connection electrode 320 may be disposed only in the display area DA and may not be disposed in the non-display area NDA.

The second organic insulating layer 130 may be disposed on the first organic insulating layer 120 in the display area DA and may cover the source layer 300. An upper surface of the second organic insulating layer 130 may be substantially flat. For example, the organic insulating material included in the second organic insulating layer 130 may include photoresist, polyacrylic resin, polyimide resin, polyamide resin, siloxane resin, acrylic resin, and epoxy resin.

The pixel electrode 410 may be disposed on the second organic insulating layer 130 in the display area DA. The pixel electrode 410 may be disposed on the flat upper surface of the second organic insulating layer 130. The pixel electrode 410 may be connected to the source electrode 232 or the drain electrode 234. The pixel electrode 410 may be disposed on the driving element 200 and may be connected to the driving element 200. The pixel electrode 410 may include a metal, a transparent conductive material, or the like.

The pixel defining layer 140 may be disposed on the second organic insulating layer 130 in the display area DA. The pixel defining layer 140 may partially cover the pixel electrode 410 on the second organic insulating layer 130. The pixel defining layer 140 may have a pixel opening exposing at least a portion of the pixel electrode 410. The pixel defining layer 140 may include an organic insulating material. For example, the organic insulating material may include photoresist, polyacrylic resin, polyimide resin, polyamide resin, siloxane resin, acrylic resin, and epoxy resin.

The emission layer 420 may be disposed on the pixel electrode 410 exposed by the pixel opening. The emission layer 420 may be disposed in the pixel opening. The emission layer 420 may be disposed between the pixel electrode 410 and the common electrode 430. For example, the material included in the emission layer 420 may include an organic light emitting material and quantum dots.

The common electrode 430 may be disposed on the emission layer 420 and may overlap the pixel electrode 410. For example, the common electrode 430 may be entirely disposed on the pixel defining layer 140. For example, unlike illustrated in the drawings, the common electrode 430 may be entirely disposed in the display area DA and the non-display area NDA. The common electrode 430 may include a transparent conductive material.

The pixel electrode 410, the emission layer 420, and the common electrode 430 may form the light emitting element 400. The light emitting element 400 may be disposed on the driving element 200 in the display area DA.

A dam DAM may include the first dam DAM1 and the second dam DAM2. The dam DAM may be disposed on the substrate 100 in the non-display area NDA. In an embodiment, the dam DAM may be disposed in the non-display area NDA to surround the display area DA. When the organic encapsulation layer 520 is formed by using an organic material such as a monomer, the dam DAM may prevent the organic material from overflowing in an edge direction of the substrate 100 (e.g. the first direction DR1 in FIG. 2).

For example, the first dam DAM1 may be disposed on the interlayer insulating layer 114 in the first dam area DMA1.

For example, the second dam DAM2 may be disposed on the interlayer insulating layer 114 in the second dam area DMA2. The second dam DAM2 may be disposed outside the first dam DAM1 and may be spaced apart from the first dam DAM1 in the first direction DR1.

In an embodiment, the dam DAM may have a multilayer structure in which a plurality of layers is stacked. Each of the first dam DAM1 and the second dam DAM2 may include first organic layers 710 and 910, second organic layers 720 and 920, third organic layers 730 and 930, and spacers 740 and 940, respectively. For example, the first organic layers 710 and 910 may be formed substantially simultaneously with the first organic insulating layer 120 and may include substantially the same material as the first organic insulating layer 120. The second organic layers 720 and 920 may be formed substantially simultaneously with the second organic insulating layer 130 and may include substantially the same material as the second organic insulating layer 130. The third organic layers 730 and 930 may be formed substantially simultaneously with the pixel defining layer 140 and may include substantially the same material as the pixel defining layer 140. The spacers 740 and 940 may be formed substantially simultaneously with the third organic layers 730 and 930 by using a halftone mask and may include substantially the same material as the third organic layers 730 and 930. The spacers 740 and 940 may function to maintain a separation distance between a mask and the substrate 100 when the emission layer 420 is formed.

The encapsulation layer 500 may be disposed on the light emitting element 400 to cover the light emitting element 400. The encapsulation layer 500 may seal the display area DA to protect the light emitting element 400 from external impurities.

The first inorganic encapsulation layer 510 may be disposed on the common electrode 430. For example, the first inorganic encapsulation layer 510 may have a substantially uniform thickness along a profile of the common electrode 430. The first inorganic encapsulation layer 510 may be entirely disposed in the display area DA and the non-display area NDA.

The organic encapsulation layer 520 may be disposed on the first inorganic encapsulation layer 510 and may cover the display area DA. The organic encapsulation layer 520 may have a substantially flat upper surface without generating a step difference around the first inorganic encapsulation layer 510.

The organic encapsulation layer 520 may be formed of an organic material (e.g., a transparent monomer) by an inkjet process. An overflow phenomenon in which the organic material overflows beyond the display area DA may occur by the inkjet process. The dam DAM may be disposed in the non-display area NDA to prevent the excessive overflow phenomenon. For example, the first dam DAM1 may prevent the overflow phenomenon from occurring outside the first area 1A. The second dam DAM2 may prevent the overflow phenomenon from occurring outside the second area 2A. As the width ds of the non-display area NDA increases due to the first dam DAM1 and the second dam DAM2, the dead space may increase. The width ds of the non-display area NDA needs to be reduced.

According to a conventional display device as the comparative example, since the first organic layer, the second organic layer, and the third organic layer of the dam include an organic insulating material, the first organic layer, the second organic layer, and the third organic layer may have a flow property. For example, when the second organic layer is formed, a reflow phenomenon in which the second organic layer flows along a side surface of the first organic layer on the first organic layer may occur. The second organic layer may cover the side surface of the first organic layer. A width of the dam may increase. As an area in which the dam is disposed increases, a width of the non-display area may increase. Accordingly, there has been a need to reduce the dead space.

The dam DAM included in the display device 1000 according to an embodiment may include first reflow prevention patterns 712 and 912. Since the first dam DAM1 and the second dam DAM2 include substantially the same components, the redundant description will be omitted for descriptive convenience and the first dam DAM1 will be described in detail.

Figure 3:
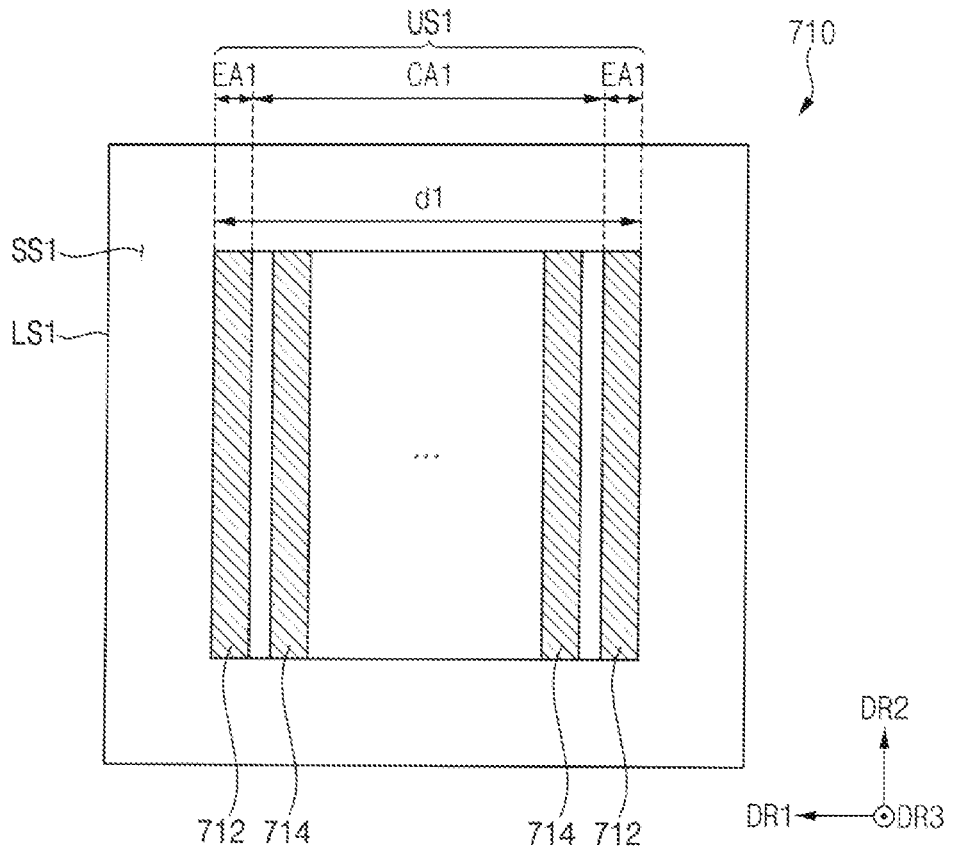
FIGS. 3 and 4 are plan views illustrating a portion of a dam included in the display device of FIG. 2.
Figure 4:
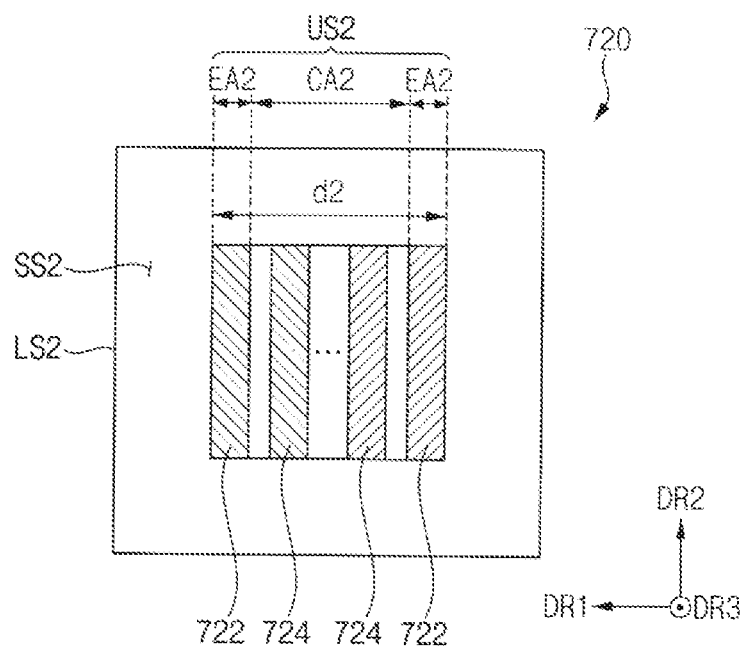

FIGS. 3 and 4 are plan views illustrating a portion of a dam included in the display device of FIG. 2. For example, FIGS. 3 and 4 illustrate a first dam. Specifically, FIG. 3 illustrates the first organic layer of the first dam, and FIG. 4 illustrates the second organic layer of the first dam.

Referring to FIGS. 2 and 3, the first dam DAM1 may include the first organic layer 710, the first reflow prevention patterns 712, and a first adhesive pattern 714. The second dam DAM2 may include the first organic layer 910, the first reflow prevention patterns 912, and a first adhesive pattern 914.

The first organic layer 710 may have an upper surface US1, a side surface SS1, and a lower surface LS1. A size (e.g., area) of the upper surface US1 of the first organic layer 710 may be less than a size (e.g., area) of the lower surface LS1 of the first organic layer 710. The upper surface US1 of the first organic layer 710 may have a center area CA1 and an edge area EA1.

The first reflow prevention patterns 712 may be disposed on the first organic layer 710. The first reflow prevention patterns 712 may be disposed on both edges (e.g., opposite edges) of the first organic layer 710. The first reflow prevention patterns 712 may be disposed on the edge area EA1. The first reflow prevention patterns 712 may include a material different from a material of the first organic layer 710. In an embodiment, the first reflow prevention patterns 712 may include a metal. The first reflow prevention patterns 712 may include the same material as the source layer 300. In another embodiment, the first reflow prevention patterns 712 may include an inorganic material.

The first reflow prevention patterns 712 may prevent the reflow phenomenon in which the second organic layer 720 flows along the side surface SS1 of the first organic layer 710 when the second organic layer 720 is formed. The second organic layer 720 may be disposed on the upper surface US1 of the first organic layer 710. The second organic layer 720 may not cover the side surface SS1 of the first organic layer 710. A width d2 of the second organic layer 720 may be less than a width d1 of the first organic layer 710. For example, the width d1 of the first organic layer 710 may be a width of an upper surface of the first organic layer 710. For example, the width d2 of the second organic layer 720 may be a width of an upper surface of the second organic layer 720.

The first adhesive pattern 714 may be disposed on the first organic layer 710. The first adhesive pattern 714 may be disposed in a center of the first organic layer 710. The first adhesive pattern 714 may be disposed in the center area CA1. The first adhesive pattern 714 may be disposed between the first reflow prevention patterns 712 (e.g., in the first direction DR1). The first adhesive pattern 714 may include a material different from a material of the first organic layer 710. In an embodiment, the first adhesive pattern 714 may include a metal. In another embodiment, the first adhesive pattern 714 may include an inorganic material. The first adhesive pattern 714 and the first reflow prevention patterns 712 may include the same material.

In an embodiment, the first adhesive pattern 714 may be formed substantially simultaneously with the first reflow prevention patterns 712 and may include substantially the same material as the first reflow prevention patterns 712.

Although it is illustrated that the first adhesive pattern 714 is provided in plurality, embodiments are not limited thereto. A single first adhesive pattern 714 may be provided.

The first adhesive pattern 714 may be spaced apart from each of the first reflow prevention patterns 712 (e.g., in the first direction DR1). The second organic layer 720 may contact a portion of the first organic layer 710 exposed by the first adhesive pattern 714 and each of the first reflow prevention patterns 712. When a plurality of first adhesive patterns 714 are provided, the second organic layer 720 may contact a portion of the first organic layer 710 exposed by the first adhesive patterns 714.

The first adhesive pattern 714 may improve adhesion force between the first organic layer 710 and the second organic layer 720. When the second organic layer 720 is disposed on the first organic layer 710 having a flat upper surface, the adhesive force may be small. The adhesion force between the first organic layer 710 and the second organic layer 720 may be improved by the first adhesive pattern 714.

The first reflow prevention patterns 712 may not only prevent the reflow phenomenon, but also improve the adhesion force between the first organic layer 710 and the second organic layer 720.

Referring to FIGS. 2, 3, and 4, the first dam DAM1 may include the second organic layer 720, second reflow prevention patterns 722, and a second adhesive pattern 724.

The second organic layer 720 may have an upper surface US2, a side surface SS2, and a lower surface LS2. A size (e.g., area) of the upper surface US2 of the second organic layer 720 may be less than a size (e.g., area) of the lower surface LS2 of the second organic layer 720. The upper surface US2 of the second organic layer 720 may have a center area CA2 and an edge area EA2.

The reflow phenomenon may not occur in the second organic layer 720 by the first reflow prevention patterns 712. The size (e.g., area) of the lower surface LS2 of the second organic layer 720 may be the same as the size (e.g., area) of the upper surface US1 of the first organic layer 710. The second organic layer 720 may not cover the side surface SS1 of the first organic layer 710, and a width d2 of the upper surface US2 of the second organic layer 720 may be less than a width d1 of the upper surface US1 of the first organic layer 710.

The second reflow prevention patterns 722 may be disposed on both edges (e.g., opposite edges) of the second organic layer 720. The second reflow prevention patterns 722 may be disposed on the edge area EA2 of the second organic layer 720. The second reflow prevention patterns 722 may include a material different from a material of the second organic layer 720. In an embodiment, the second reflow prevention patterns 722 may include a metal. The second reflow prevention patterns 722 may include the same material as the pixel electrode 410. In another embodiment, the second reflow prevention patterns 722 may include an inorganic material.

The second reflow prevention patterns 722 may prevent the reflow phenomenon in which the third organic layer 730 flows along the side surface SS2 of the second organic layer 720. The third organic layer 730 may be disposed on the upper surface US2 of the second organic layer 720. The third organic layer 730 may not cover the side surface SS2 of the second organic layer 720. A width of the third organic layer 730 may be less than a width of the second organic layer 720.

The second adhesive pattern 724 may be disposed between the second reflow prevention patterns 722 (e.g., in the first direction DR1). The second adhesive pattern 724 may be formed substantially simultaneously with the second reflow prevention patterns 722 and may include substantially the same material as the second reflow prevention patterns 722.

The second adhesion pattern 724 may improve the adhesion force between the second organic layer 720 and the third organic layer 730. The second reflow prevention patterns 722 may not only prevent the reflow phenomenon, but also improve the adhesion force between the second organic layer 720 and the third organic layer 730.

FIGS. 5A, 5B, 5C, 5D, 5E, and 5F are cross-sectional views illustrating a method of manufacturing the display device of FIG. 2.

Figure 5A:
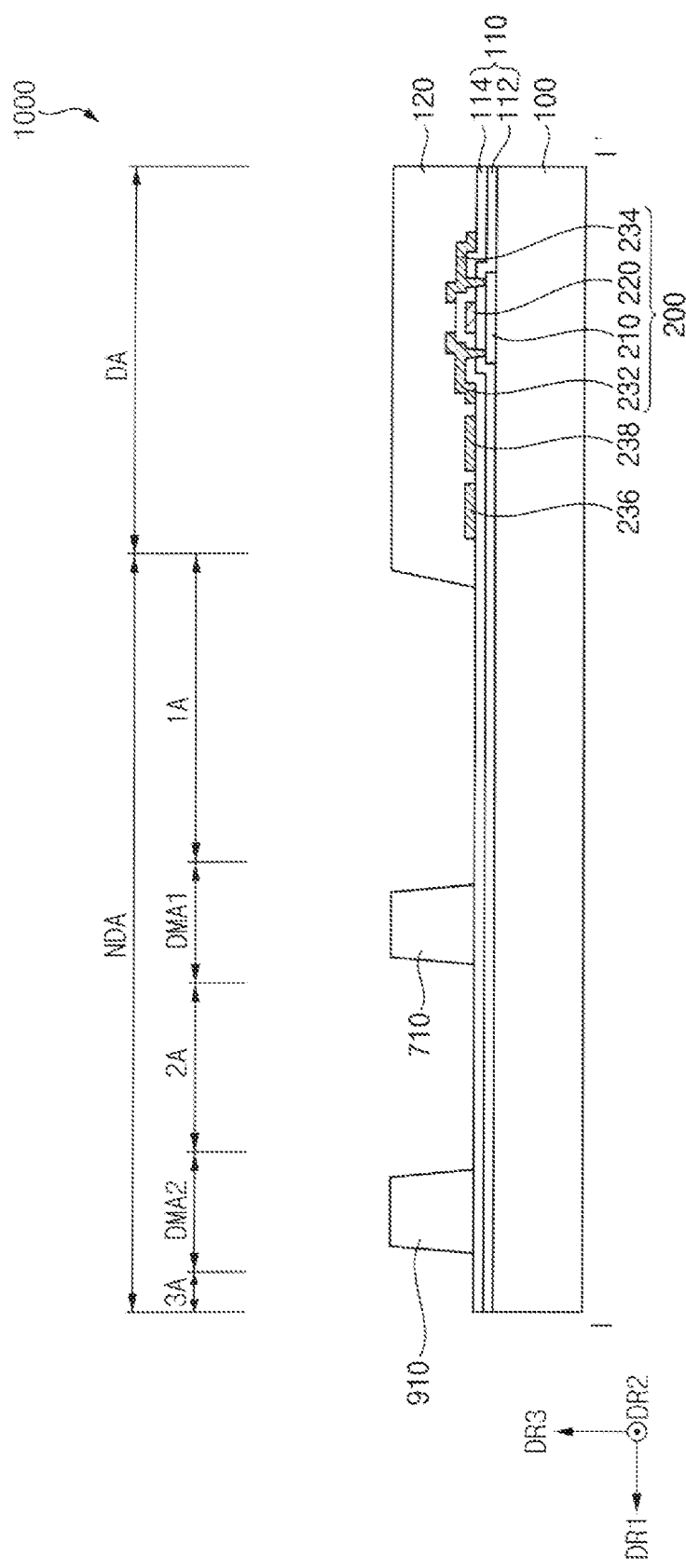
FIGS. 5A, 5B, 5C, 5D, 5E, and 5F are cross-sectional views illustrating a method of manufacturing the display device of FIG. 2.

Referring to FIG. 5A, a method of manufacturing the display device 1000 may include forming the driving element 200 on the substrate 100.

When the source electrode 232 and the drain electrode 234 of the driving element 200 are formed, the low power line 236 and the high power line 238 may be simultaneously formed. The source electrode 232, the drain electrode 234, the low power line 236, and the high power line 238 may include the same material.

The first organic insulating layer 120 and the first organic layers 710 and 910 may be formed on the driving element 200. The first organic insulating layer 120 and the first organic layers 710 and 910 may be formed substantially simultaneously, and may include substantially the same material.

Figure 5B:
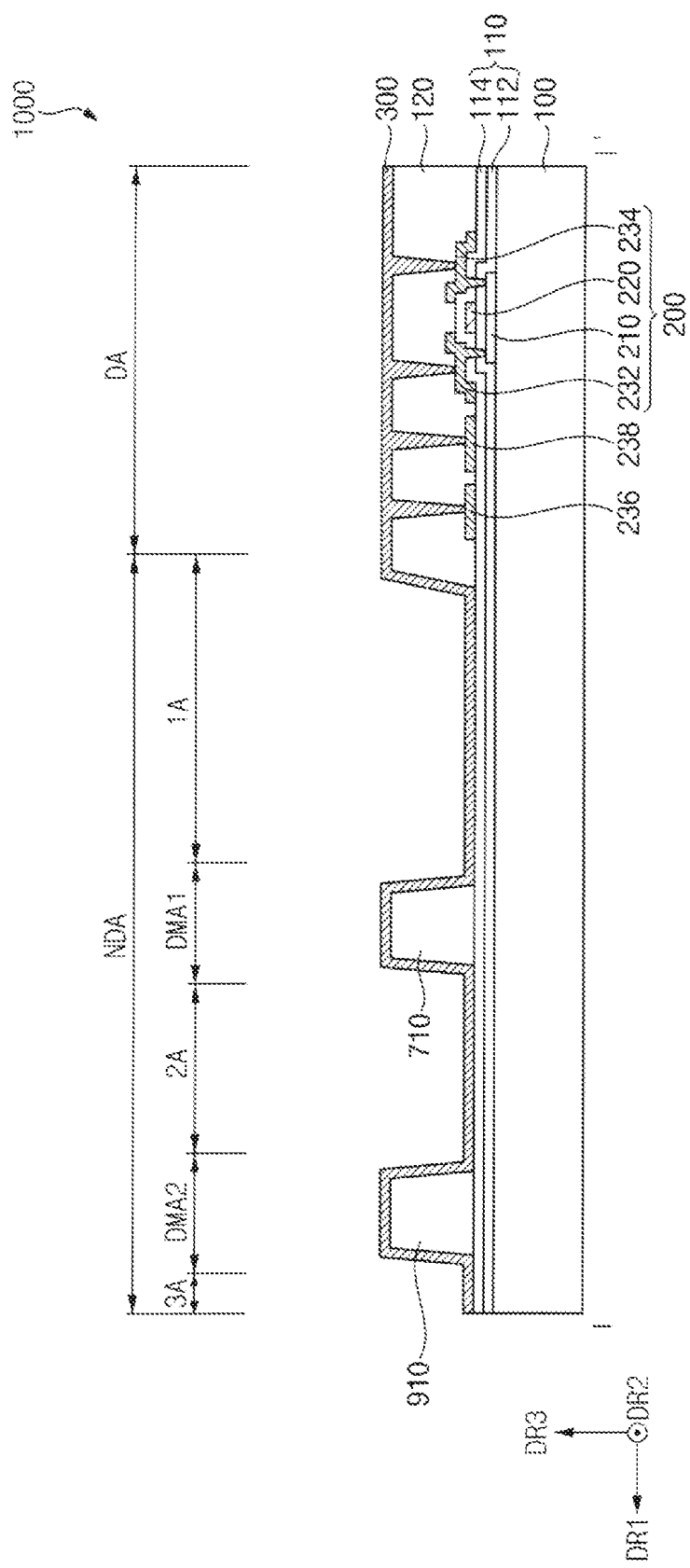

Referring to FIG. 5B, the source layer 300 may be formed entirely on the first organic insulating layer 120 and the first organic layers 710 and 910 in the display area DA and the non-display area NDA.

Figure 5C:
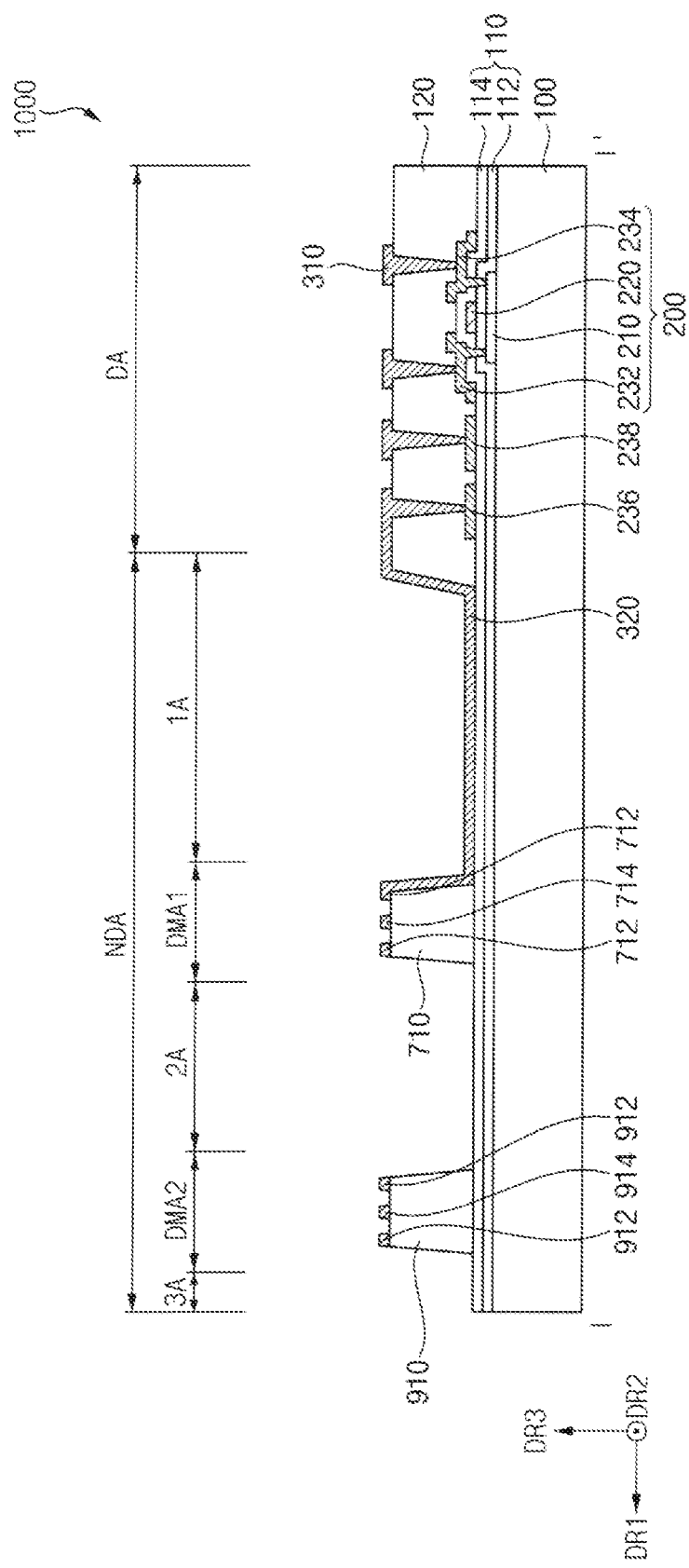

Referring to FIG. 5C, the source layer 300 is patterned to form the first connection electrode 310, the second connection electrode 320, the first reflow prevention patterns 712 and 912, and the first adhesive patterns 714 and 914. The first connection electrode 310, the second connection electrode 320, the first reflow prevention patterns 712 and 912, and the first adhesive patterns 714 and 914 may be formed substantially simultaneously and may include substantially the same material. The source layer 300 may be patterned so that the second connection electrode 320 extends from the display area DA to the non-display area NDA to be connected to the first reflow prevention patterns 712. However, embodiments are not limited thereto.

Figure 5D:
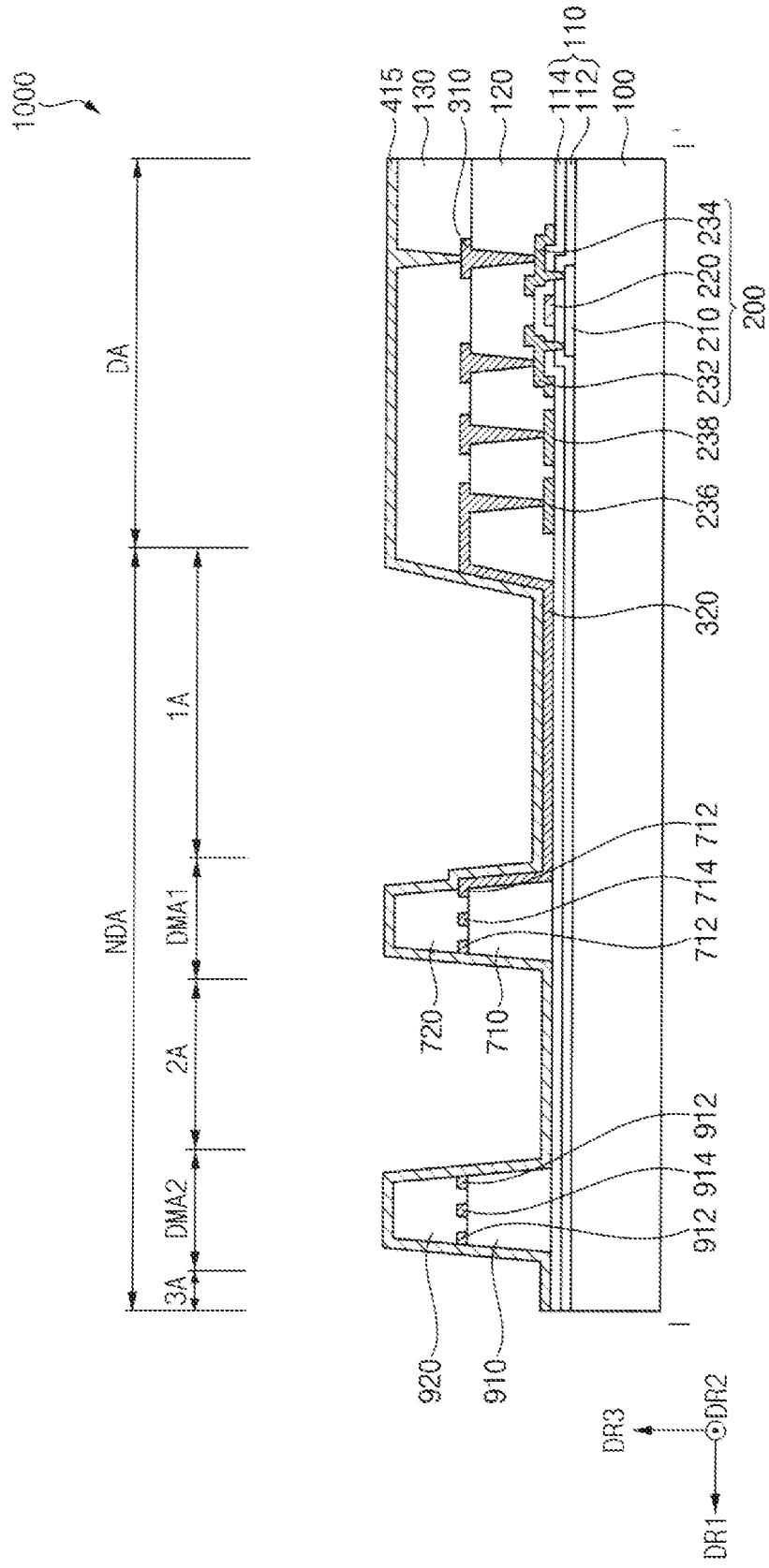

Referring to FIG. 5D, the second organic insulating layer 130 and the second organic layers 720 and 920 may be formed on the first connection electrode 310, the second connection electrode 320, the first reflow prevention patterns 712 and 912, and the first adhesive pattern 714 and 914. The second organic insulating layer 130 and the second organic layers 720 and 920 may be formed substantially simultaneously and may include substantially the same material.

An anode layer 415 may be formed entirely on the second organic insulating layer 130 and the second organic layers 720 and 920 in the display area DA and the non-display area NDA.

Figure 5E:
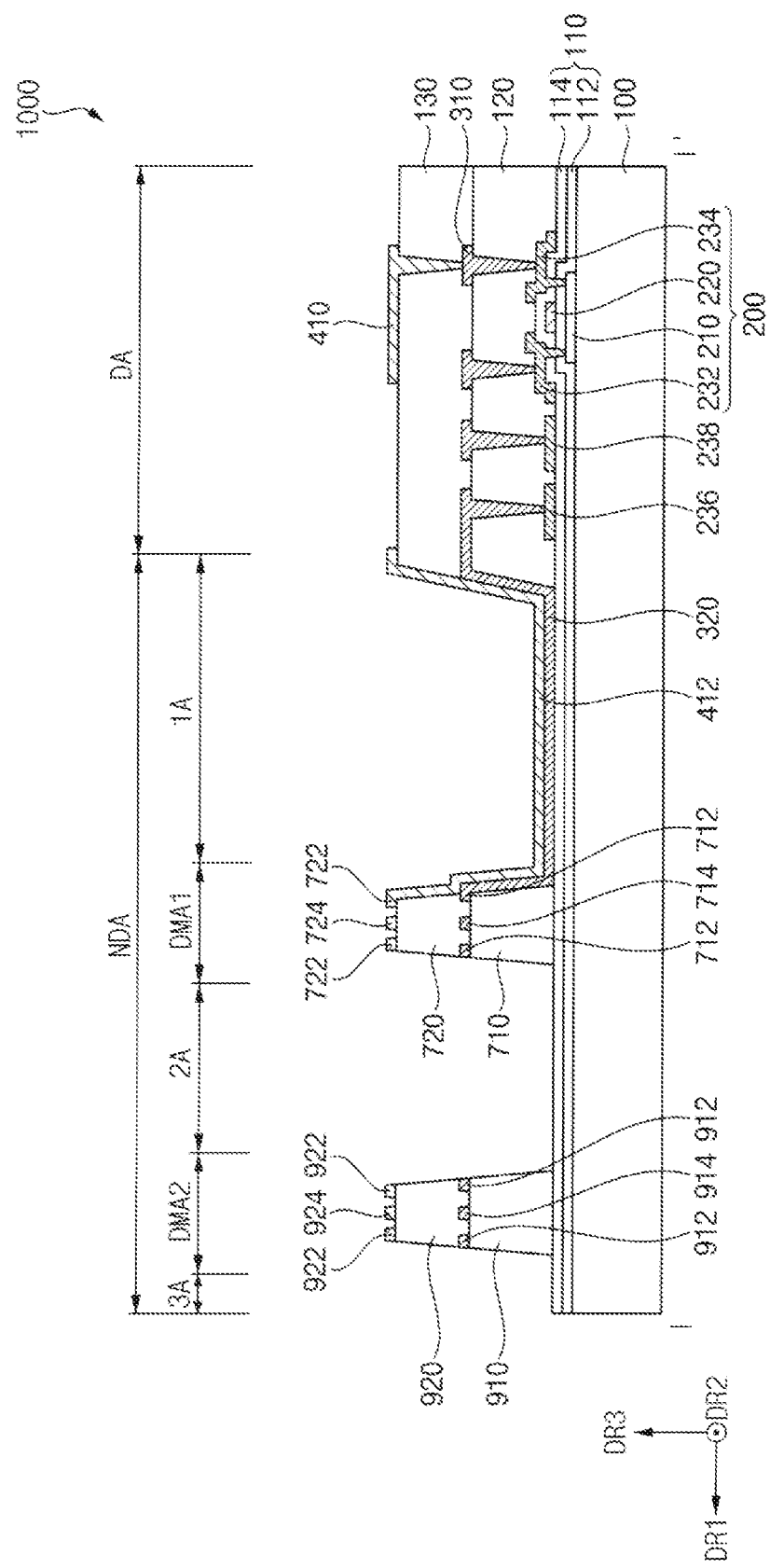

Referring to FIG. 5E, the anode layer 415 may be patterned to form the pixel electrode 410, a third connection electrode 412, the second reflow prevention patterns 722 and 922, and the second adhesive patterns 724 and 924. The pixel electrode 410, the third connection electrode 412, the second reflow prevention patterns 722 and 922, and the second adhesive patterns 724 and 924 may be formed substantially simultaneously and may include substantially the same material. The anode layer 415 may be patterned so that the third connection electrode 412 extends from the display area DA to the non-display area NDA to be connected to the second reflow prevention patterns 722. However, embodiments are not limited thereto.

Figure 5F:
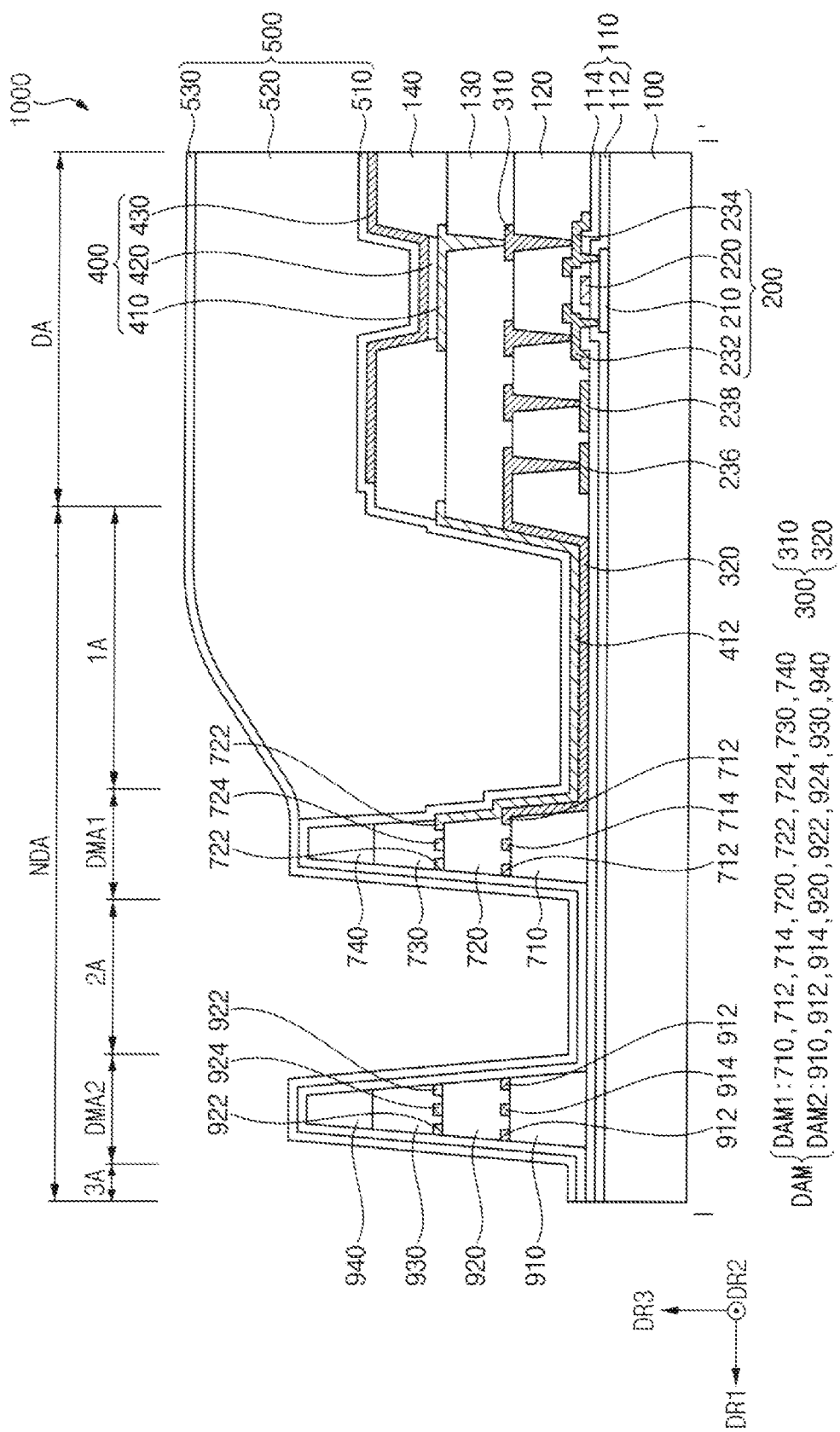

Referring to FIG. 5F, the pixel defining layer 140 and the third organic layers 730 and 930 may be formed on the pixel electrode 410, the third connection electrode 412, the second reflow prevention patterns 722 and 922, and the second adhesive patterns 724 and 924. The pixel defining layer 140 and the third organic layers 730 and 930 may be formed substantially simultaneously and may include substantially the same material. The spacers 740 and 940 may be formed on the third organic layers 730 and 930. When the spacers 740 and 940 are formed by using a halftone mask, the pixel defining layer 140, the third organic layers 730 and 930, and the spacers 740 and 940 may be formed substantially simultaneously.

The emission layer 420 and the common electrode 430 may be sequentially formed on the pixel defining layer 140.

The first inorganic encapsulation layer 510 may be entirely formed on the common electrode 430 and the spacers 740 and 940 in the display area DA and the non-display area NDA.

The organic encapsulation layer 520 may be formed on the first inorganic encapsulation layer 510 in the display area DA. In this case, the overflow phenomenon may occur so that the organic encapsulation layer 520 overflows beyond the display area DA and the organic encapsulation layer 520 may be formed in a portion of the non-display area NDA. The dam DAM may prevent the organic encapsulation layer 520 from excessively overflowing in the first direction DR1.

The second inorganic encapsulation layer 530 may be formed entirely on the organic encapsulation layer 520 in the display area DA and the non-display area NDA.

Figure 6:
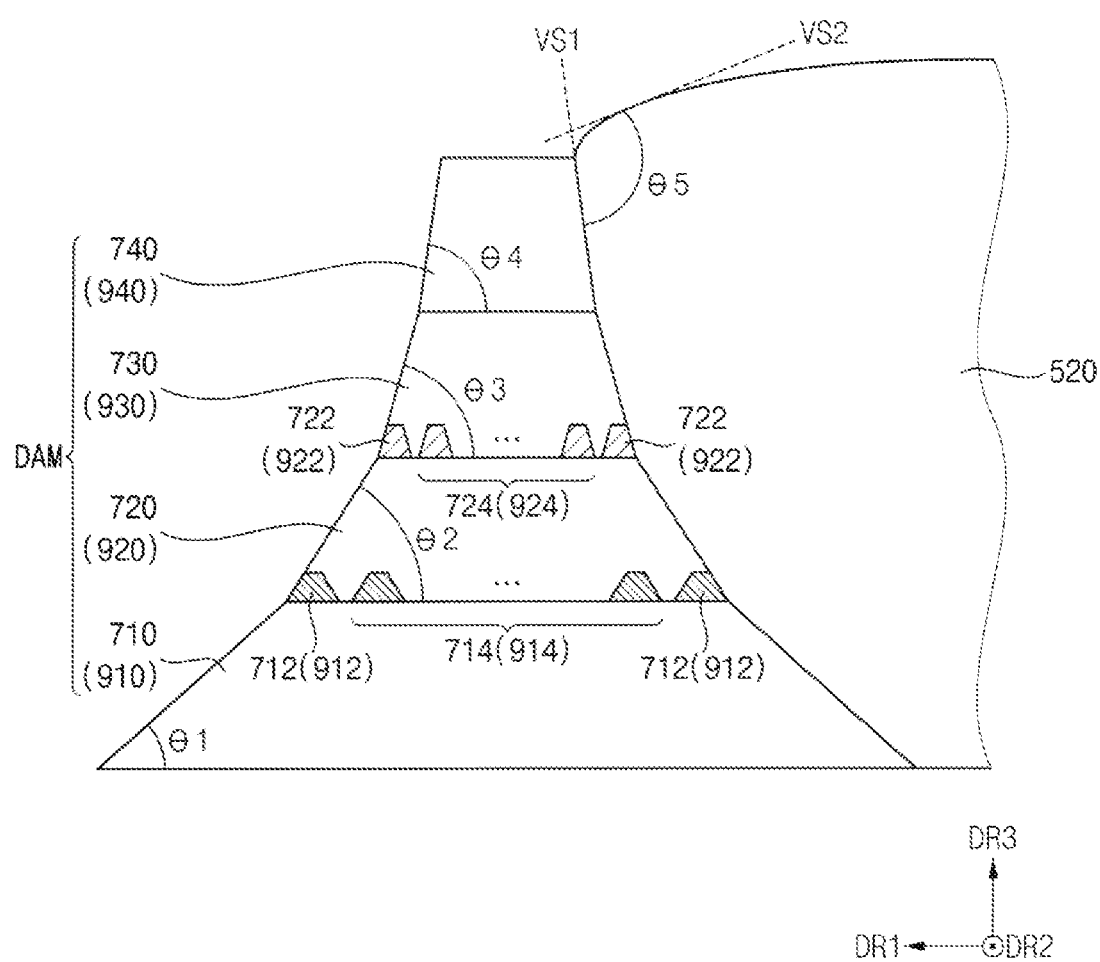
FIG. 6 is an enlarged view illustrating an example of a dam included in the display device of FIG. 2.

FIG. 6 is an enlarged view illustrating an example of a dam included in the display device of FIG. 2. For example, FIG. 6 illustrates a case in which the first dam prevents the overflow phenomenon as illustrated in FIG. 2. FIG. 6 illustrates an example of the first dam, but the second dam may also have the same structure as the first dam.

Referring to FIG. 6, the first dam DAM1 may prevent the organic encapsulation layer 520 including an organic material such as a monomer from overflowing in the first direction DR1. A first virtual surface VS1 from which a side surface of the spacer 740 extends and a second virtual surface VS2 in contact with the organic encapsulation layer 520 may define an overflow angle $\theta_5$.

A side surface of the first organic layer 710 may have a predetermined inclination angle $\theta_1$.

Since the first reflow prevention patterns 712 and the first adhesive pattern 714 are disposed on the first organic layer 710, an inclination angle $\theta_2$ of a side surface of the second organic layer 720 may be greater than the inclination angle $\theta_1$ of the side surface of the first organic layer 710. Since the second reflow prevention patterns 722 and the second adhesive pattern 724 are disposed on the second organic layer 720, an inclination angle $\theta_3$ of a side surface of the third organic layer 730 may be greater than the inclination angle $\theta_2$ of the side surface of the second organic layer 720.

An inclination angle $\theta_4$ of a side surface of the spacer 740 may be greater than the inclination angle $\theta_1$ of the side surface of the first organic layer 710. For example, the inclination angle $\theta_4$ of the side surface of the spacer 740 may be about 90 degrees. Due to this, the overflow angle $\theta_5$ may increase. The first dam DAM1 may effectively prevent the overflow phenomenon.

Figure 7:
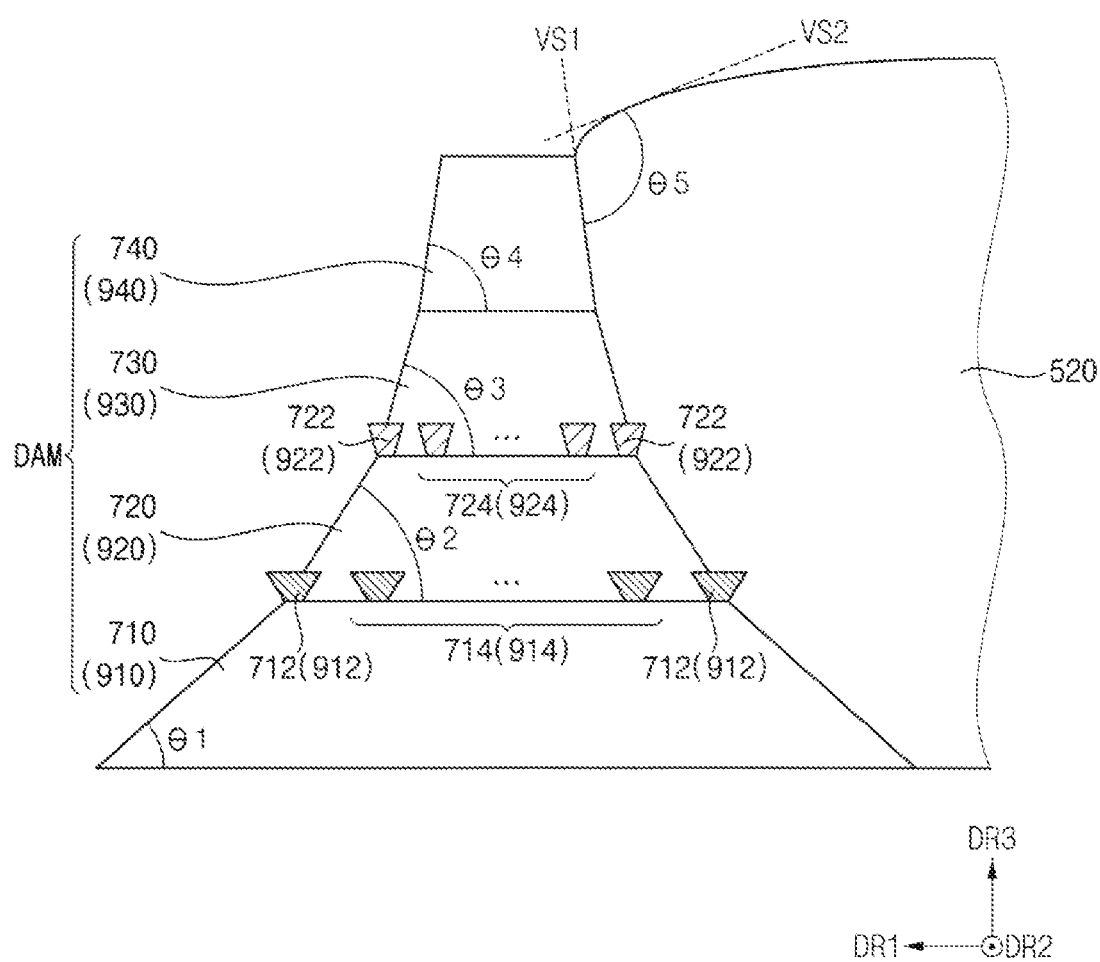
FIG. 7 is an enlarged view illustrating another example of a dam included in the display device of FIG. 2.

FIG. 7 is an enlarged view illustrating another example of a dam included in the display device of FIG. 2. The same reference numerals are used for the same components as in FIG. 6, and redundant descriptions of the same components will be omitted for descriptive convenience.

Referring to FIG. 7, the first adhesive pattern 714 may have an inverse tapered shape. For example, a size (e.g., width or length) of an upper surface of the first adhesive pattern 714 may be greater than a size (width or length) of a bottom surface of the first adhesive pattern 714. The second adhesive pattern 724 may have an inverse tapered shape. For example, a size (e.g., width or length) of an upper surface of the second adhesive pattern 724 may be greater than a size (width or length) of a bottom surface of the second adhesive pattern 724.

The first adhesive pattern 714 having the inverse tapered shape may effectively improve the adhesive force between the first organic layer 710 and the second organic layer 720. The second adhesive pattern 724 having the inverse tapered shape may effectively improve the adhesive force between the second organic layer 720 and the third organic layer 730.

Since the first reflow prevention patterns 712 and the second reflow prevention patterns 722 may also function to improve the adhesion force, each of the first reflow prevention patterns 712 and the second reflow prevention patterns 722 may have an inverse tapered shape. For example, a size (e.g., width or length) of an upper surface of the first reflow prevention patterns 712 may be greater than a size (width or length) of a bottom surface of the first reflow prevention patterns 712. For example, a size (e.g., width or length) of an upper surface of the second reflow prevention patterns 722 may be greater than a size (width or length) of a bottom surface of the second reflow prevention patterns 722.

Figure 8:
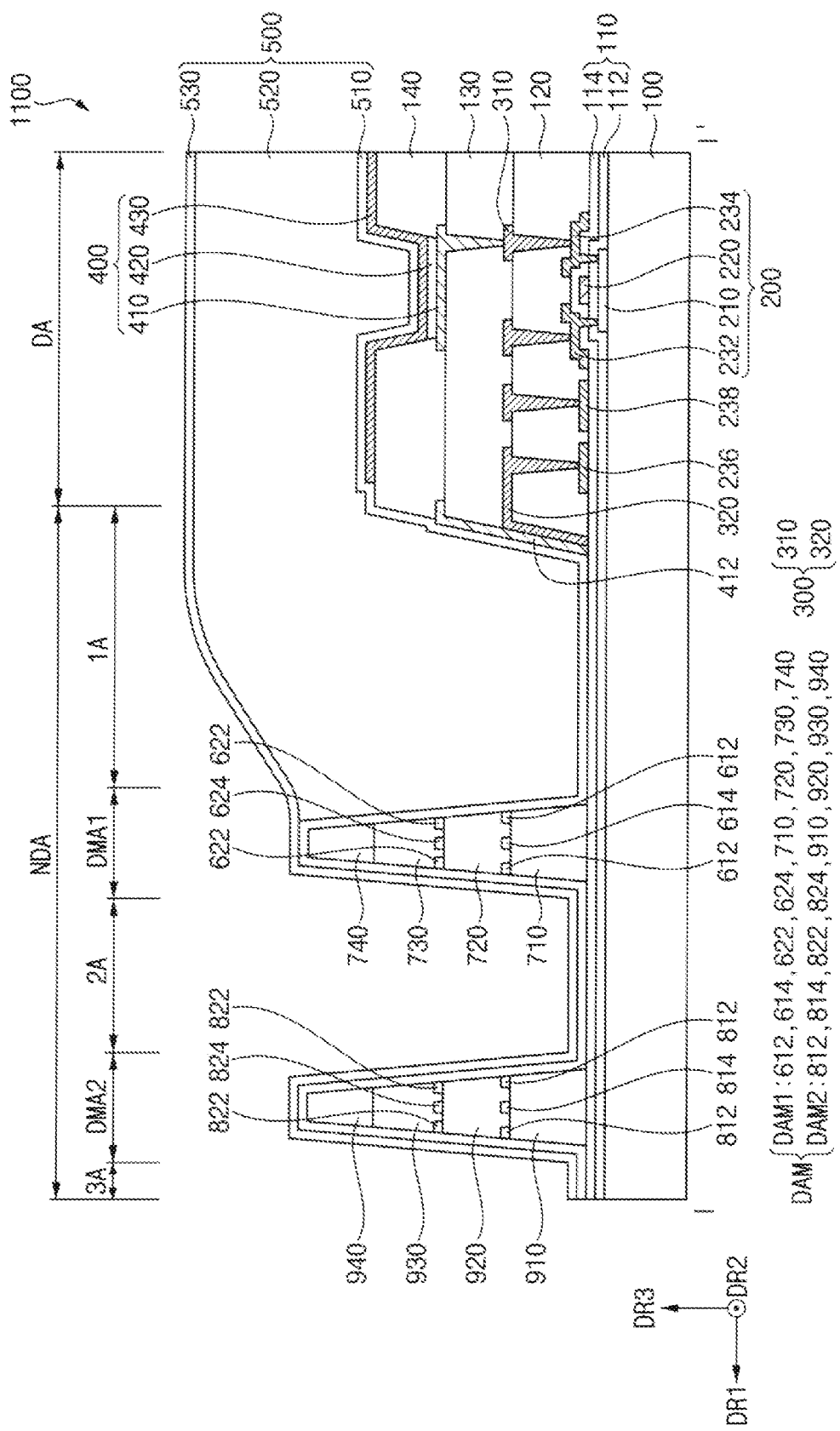
FIG. 8 is a cross-sectional view of another embodiment of the display device of FIG. 1.

FIG. 8 is a cross-sectional view illustrating a display device according to another embodiment. The same reference numerals are used for the same components as in FIG. 2, and redundant descriptions of the same components will be omitted for descriptive convenience.

Referring to FIG. 8, the first reflow prevention patterns 612 and 812, the first adhesive patterns 614 and 814, and the second reflow prevention patterns 622 and 822, and the second adhesive patterns 624 and 824 included in the display device 1100 according to another embodiment may include an inorganic material. In this case, the first reflow prevention patterns 612 may not be connected to the second connection electrode 320 and the second reflow prevention patterns 622 may not be connected to the third connection electrode 412.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate having a display area and a non-display area surrounding the display area;
   a driving element disposed on the substrate in the display area;
   a light emitting element disposed on the driving element; and a dam disposed on the substrate in the non-display area and surrounding the display area, and wherein the dam comprises:

a first organic layer;

a first reflow prevention patterns disposed on both edges of the first organic layer and comprising a material different from a material of the first organic layer; and a second organic layer disposed on the first organic layer and contacting the first organic layer exposed by the first reflow prevention patterns and wherein an inclination angle of a side surface of the second organic layer is greater than the inclination angle of a side surface of the first organic layer.

2. The display device of claim 1, wherein the first reflow prevention patterns comprise an inorganic material.

3. The display device of claim 1, wherein the first reflow prevention patterns comprise a metal.

4. The display device of claim 1, wherein the dam further comprises a first adhesive pattern disposed between the first reflow prevention patterns.

5. The display device of claim 4, wherein the first reflow prevention patterns and the first adhesive pattern comprise a same material.

6. The display device of claim 4, wherein the first adhesive pattern has an inverse tapered shape.

7. The display device of claim 1, further comprising a source layer disposed between the driving element and the light emitting element, and wherein the source layer and the first reflow prevention patterns comprise a same material.

8. The display device of claim 1, wherein the dam further comprises:

a second reflow prevention patterns disposed on both edges of the second organic layer and comprising a material different from a material of the second organic layer; and a third organic layer disposed on the second organic layer and contacting the second organic layer exposed by the second reflow prevention patterns.

9. The display device of claim 8, wherein the light emitting element comprises:

a pixel electrode;

an emission layer disposed on the pixel electrode; and a common electrode disposed on the emission layer, and wherein the pixel electrode and the second reflow prevention patterns comprise a same material.

10. The display device of claim 8, wherein the dam further comprises a second adhesive pattern disposed between the second reflow prevention patterns.

11. The display device of claim 10, wherein the second reflow prevention patterns and the second adhesive pattern comprise a same material.

12. The display device of claim 10, wherein the second adhesive pattern has an inverse tapered shape.

13. The display device of claim 1, wherein the second organic layer does not cover a side surface of the first organic layer.

14. The display device of claim 1, wherein a width of the second organic layer is less than a width of the first organic layer.

15. The display device of claim 1, wherein the dam further comprises a spacer disposed on the second organic layer.

16. A display device comprising:

a substrate having a display area and a non-display area surrounding the display area;

a driving element disposed on the substrate in the display area;

a light emitting element disposed on the driving element;

a source layer disposed between the driving element and the light emitting element; and a dam disposed on the substrate in the non-display area and surrounding the display area, and wherein the dam comprises:

a first organic layer;

a first reflow prevention patterns disposed on both edges of the first organic layer and comprising a same material as the source layer;

a first adhesive pattern disposed between the first reflow prevention patterns; and a second organic layer disposed on the first organic layer and contacting the first organic layer exposed by the first reflow prevention patterns and wherein an inclination angle of a side surface of the second organic layer is greater than the inclination angle of a side surface of the first organic layer.

17. The display device of claim 16, wherein the first reflow prevention patterns and the first adhesive pattern comprise a same material.

18. The display device of claim 16, wherein the dam further comprises:

a second reflow prevention patterns disposed on both edges of the second organic layer and comprising a material different from a material of the second organic layer;

a second adhesive pattern disposed between the second reflow prevention patterns; and a third organic layer disposed on the second organic layer and contacting the second organic layer exposed by the second reflow prevention patterns.

19. The display device of claim 18, wherein the second reflow prevention patterns and the second adhesive pattern comprise a same material.

* * * * *